(12) United States Patent
Cohen et al.

(10) Patent No.: US 7,256,146 B2
(45) Date of Patent: Aug. 14, 2007

(54) METHOD OF FORMING A CERAMIC DIFFUSION BARRIER LAYER

(75) Inventors: Stephan A. Cohen, Wappingers Falls, NY (US); Stephen McConnell Gates, Ossining, NY (US); Jeffrey C. Hedrick, Montvale, NJ (US); Elbert E. Huang, Tarrytown, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 11/128,493

(22) Filed: May 13, 2005

(65) Prior Publication Data

US 2005/0206004 A1     Sep. 22, 2005

Related U.S. Application Data

(62) Division of application No. 10/627,794, filed on Jul. 25, 2003, now Pat. No. 6,940,173.

(60) Provisional application No. 60/443,504, filed on Jan. 29, 2003.

(51) Int. Cl.
H01L 21/31 (2006.01)
(52) U.S. Cl. .............. 438/790; 438/782; 438/789; 438/781; 438/786; 257/E23.167; 257/E21.262; 257/E21.263; 257/E21.273; 257/E21.277
(58) Field of Classification Search .......... 438/623, 438/624, 781, 782, 786, 789, 790; 427/97.5, 427/98.3, 126.2; 257/E23.167, E21.262, 257/E21.263, E21.273, E21.277
See application file for complete search history.

(56) References Cited

U.S. PATENT DOCUMENTS

| 4,365,264 | A  | 12/1982 | Mukai et al. |
| 5,009,986 | A  | 4/1991  | Kawaguchi et al. |
| 6,458,516 | B1 | 10/2002 | Ye et al. |
| 6,489,030 | B1 | 12/2002 | Wu et al. |
| 6,803,660 | B1 | 10/2004 | Gates et al. |
| 2003/0087082 | A1* | 5/2003 | Boisvert et al. .......... 428/312.6 |
| 2003/0224591 | A1* | 12/2003 | Latchford et al. .......... 438/619 |
| 2004/0010667 | A1 | 1/2004 | Brenner |
| 2004/0147111 | A1 | 7/2004 | Huang et al. |
| 2004/0147115 | A1 | 7/2004 | Goundar et al. |
| 2004/0147138 | A1 | 7/2004 | Vaartstra |

* cited by examiner

Primary Examiner—Matthew Smith
Assistant Examiner—Julio J. Maldonado
(74) Attorney, Agent, or Firm—Scully, Scott, Murphy & Presser, P.C.; Daniel P. Morris, Esq.

(57) ABSTRACT

The present invention comprises an interconnect structure including a metal, interlayer dielectric and a ceramic diffusion barrier formed therebetween, where the ceramic diffusion barrier has a composition $Si_vN_wC_xO_yH_z$, where $0.1 \leq v \leq 0.9$, $0 \leq w \leq 0.5$, $0.01 \leq x \leq 0.9$, $0 \leq y \leq 0.7$, $0.01 \leq z \leq 0.8$ for $v+w+x+y+z=1$. The ceramic diffusion barrier acts as a diffusion barrier to metals, i.e., copper. The present invention also comprises a method for forming the inventive ceramic diffusion barrier including the steps depositing a polymeric preceramic having a composition $Si_vN_wC_xO_yH_z$, where $0.1<v<0.8$, $0<w<0.8$, $0.05<x<0.8$, $0<y<0.3$, $0.05<z<0.8$ for $v+w+x+y+z=1$ and then converting the polymeric preceramic layer into a ceramic diffusion barrier by thermal methods.

8 Claims, 4 Drawing Sheets

Cross Sectional View of Semiconductor Device

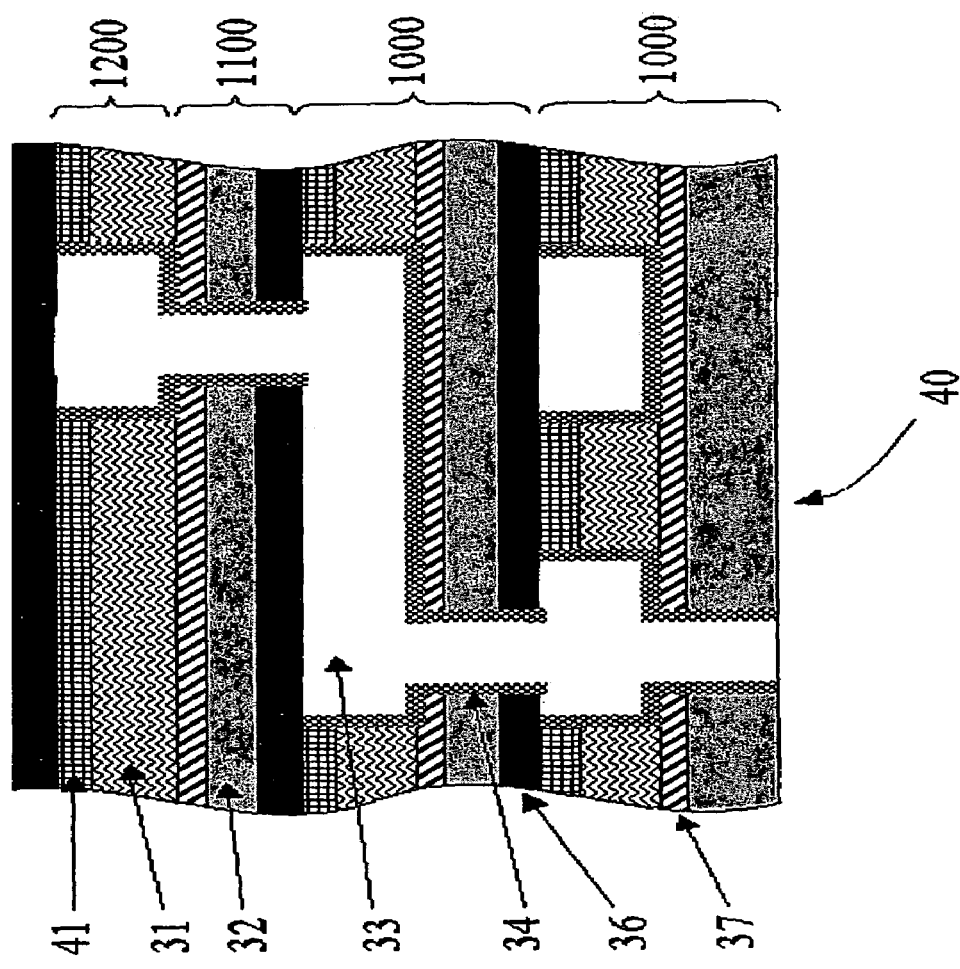
Figure 1: Cross Sectional View of Semiconductor Device

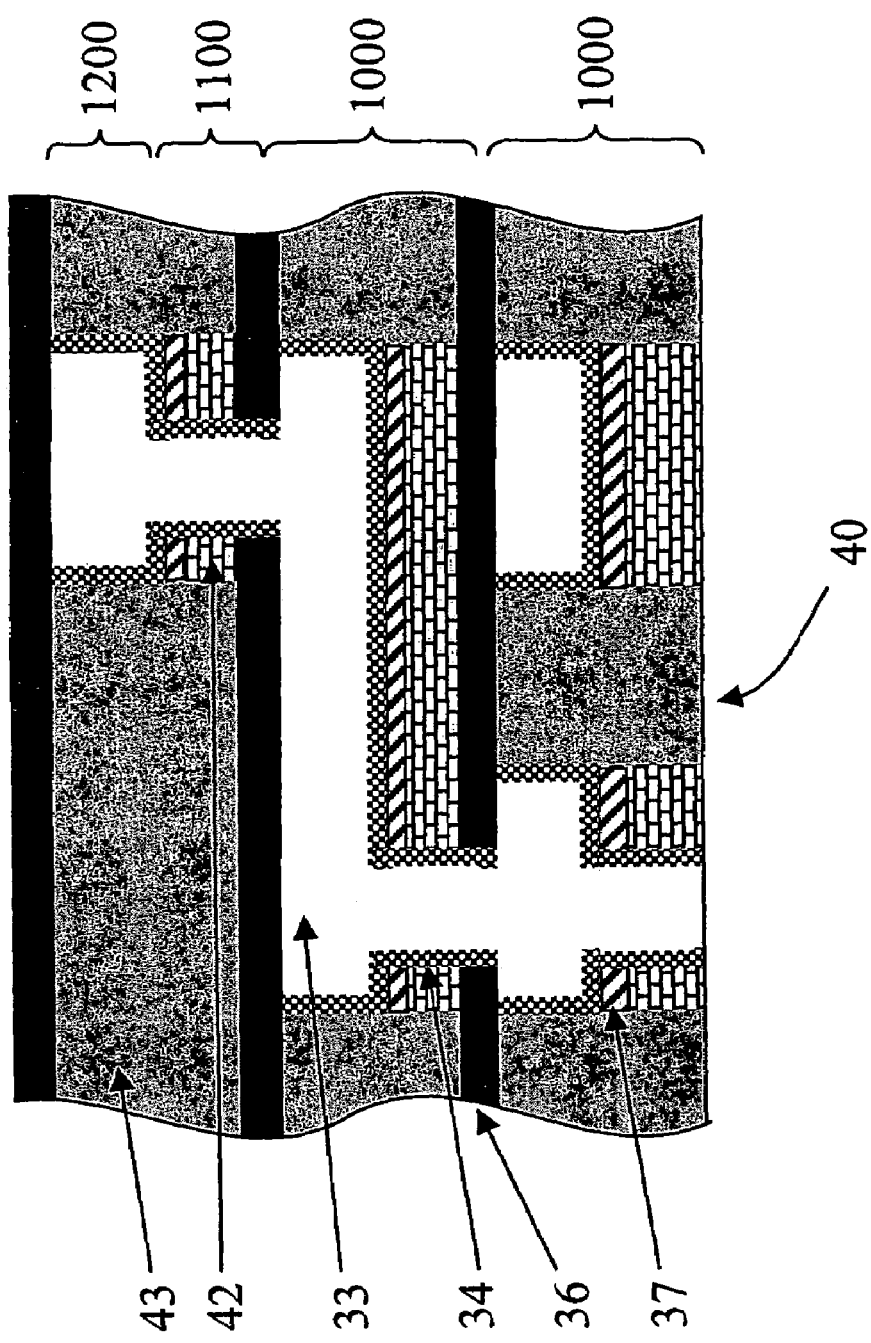
Figure 2: Cross Sectional View of Semiconductor Device

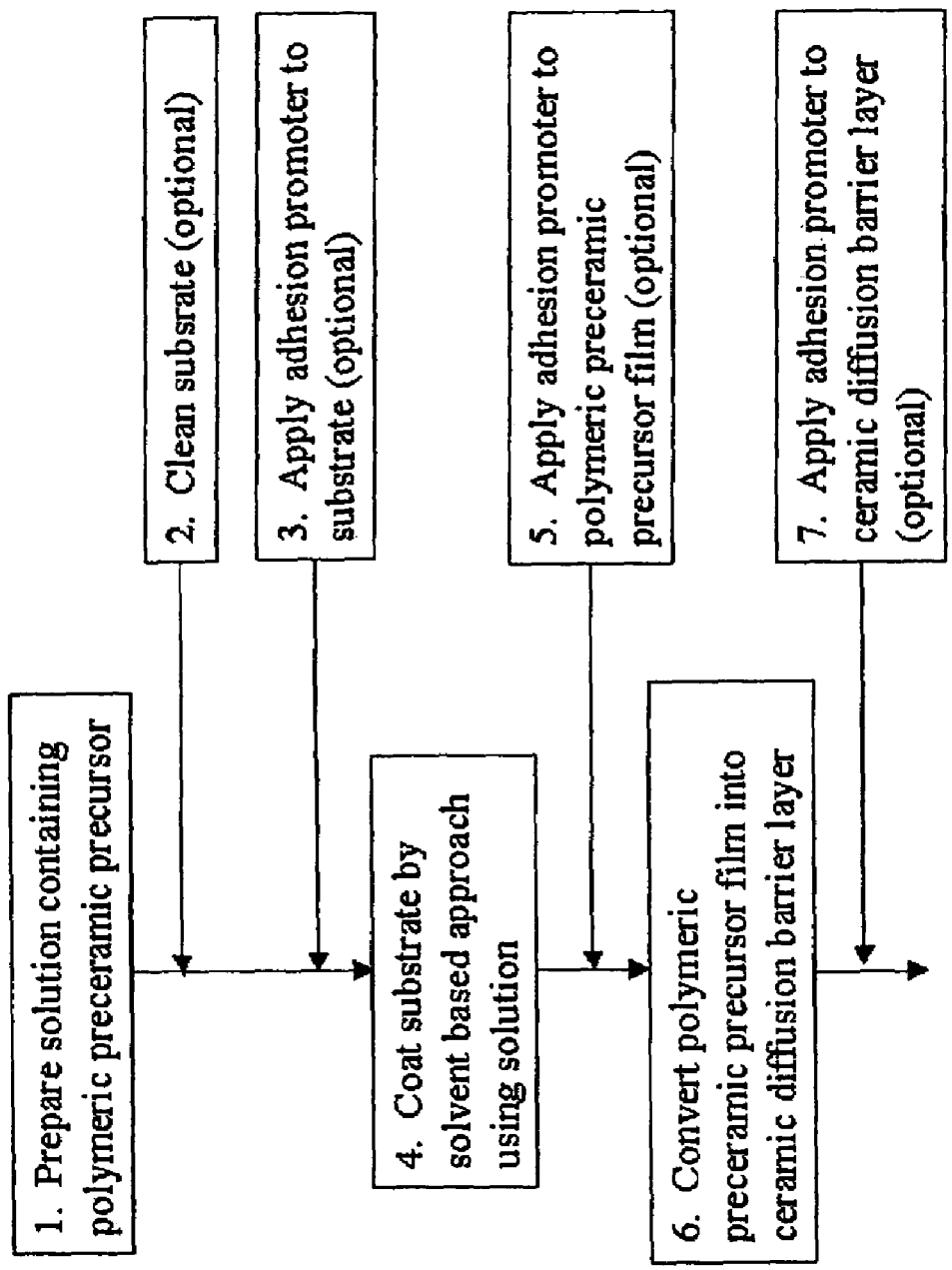
Figure 3: General Process Flow for Generation of Ceramic Diffusion Barrier Layer Figure 4: Electrical Data of Ceramic Diffusion Barrier Layer Generated from Polysilazane Polymer Preceramic Precursor

METHOD OF FORMING A CERAMIC DIFFUSION BARRIER LAYER

CROSS REFERENCE TO RELATED APPLICATION

This application is a divisional of U.S. application Ser. No. 10/627,794, filed Jul. 25, 2003, now U.S. Pat. No. 6,940,173 which claims the benefit of U.S. provisional patent application 60/443,504 filed Jan. 29, 2003 the whole contents and disclosure of which is incorporated by reference as is disclosure of which is incorporated by reference as is fully set forth herein.

BACKGROUND OF THE INVENTION

1. Field of the Invention

The present invention relates to the utilization of dielectric layers that have low dielectric constants ($k \leq 3.3$) and have barrier properties to metal diffusion. More particularly, it relates to the use of the dielectric barrier layers in metal interconnect structures, which are part of integrated circuits and microelectronic devices. The primary advantage that is provided by this invention is the reduction in the capacitance between conducting metal features, e.g., copper lines, that results in an enhancement in overall chip performance.

2. Background Art

Materials which function as diffusion barriers to metal, may be incorporated in metal interconnect structures that are a part of integrated circuits. Diffusion barriers to metal are typically required to generate reliable devices, since low-k interlayer dielectrics typically do not prohibit metal diffusion. The placement of metal diffusion barrier materials in interconnect structures may differ and often is dependent upon the properties of the metal diffusion barrier and the means in which they are processed. Barrier layers comprised of metal and dielectrics are commonly utilized in interconnect structures.

Diffusion barrier layers, comprised of metal include, but are not limited to: tantalum, tungsten, ruthenium, tantalum nitride, titanium nitride, TiSiN, etc. Diffusion barrier layers often serve as liners, whereby they form a conformal interface with metal conducting structures. Normally, these materials are deposited by chemical vapor deposition (CVD), plasma-enhanced chemical vapor deposition (PECVD), atomic layer deposition (ALD), sputtering, thermal evaporation, and other related approaches. To utilize these materials as barrier layers, the metal barrier layers must be conformal to conducting metal lines and cannot be placed as blanket layers that would serve as conducting pathways.

There are numerous approaches in which this can be accomplished. One limiting criteria for these barrier layers is that their contribution to the resistivity of conducting metal lines must not be excessively high; otherwise, the increase in the total resistance of the metal conducting structures would result in reduced performance.

Diffusion barrier layers comprised of dielectrics including, but not limited to: silicon nitrides, silicon carbides, and silicon carbonitrides, are also utilized in microelectronic devices. These materials are normally deposited by chemical vapor deposition (CVD) and plasma-enhanced chemical vapor deposition (PECVD) approaches and can be deposited as continuous films. Unlike diffusion barrier layers comprised of metal, the dielectric layers can be deposited as blanket films and can be placed between conducting metal lines. In doing so, these dielectric layers contribute to the capacitance between metal lines. A limiting constraint of these systems is their relatively high dielectric constants ($k=4.5$ through $7.0$) that result in a substantial increase in the effective dielectric constant between metal lines leading to reduced device performance. Decreasing the film thickness of these barrier layers can also lead to reductions in the effective dielectric constant "k"; however, insufficiently thick layers may not be reliable and nevertheless may still make a significant negative contribution to the dielectric constant. Another disadvantage of these systems is the cost and complexity associated with the tools and processes involved in their deposition.

Barrier layer films that are generated by spin-coating dielectrics, or other solvent based approaches, having an appropriate copper binding moiety to prohibit copper diffusion, have also been proposed. These systems are based on the addition of the copper binding moiety as an additive and have several potential drawbacks. Due to the lack of covalent bonding of the moiety to the dielectric matrix, the moiety may be expelled from the matrix by diffusion processes, solvent extraction, and thermolysis, resulting in a loss of the copper barrier properties.

SUMMARY OF THE INVENTION

This invention relates to interconnect structures having a ceramic diffusion barrier layer with a low dielectric constant (e.g. $k \leq 3.3$), which serves as a barrier to metal diffusion and is applied by a solvent based approach, e.g., spin coating. The invention can be employed in any microelectronic device that utilizes metal interconnect structures including, but not limited to: high speed microprocessors, application specific integrated circuits (ASICs), and memory storage. The utilization of the spin-on low-k ceramic diffusion barrier layer is advantageous in comparison to prior art approaches, as it may allow the facile generation of a diffusion barrier layer in a cost-effective manner and may result in microelectronic devices with increased performance through a reduction in the capacitance between conducting metal lines.

The interconnect structure may be comprised of at least one conducting metal feature, formed on the substrate, with the substrate further comprising at least one insulating layer surrounding the conducting metal feature. The insulating layer may surround at least one conducting metal feature at its bottom, top, and lateral surfaces. The structure may further comprise at least one conductive barrier layer formed on at least one interface between the insulating layer and the conducting metal feature. The combination of the conducting metal feature and the insulating layers, may be repeated to form a multilevel interconnect stack.

The interconnect structure may be one of a silicon wafer containing microelectronic devices, a ceramic chip carrier, an organic chip carrier, a glass substrate, a gallium arsenide wafer, silicon carbide wafer, a gallium wafer, or other semiconductor wafer.

In the first embodiment of this invention, an interconnect structure having the ceramic diffusion barrier layer is described. In broad terms the inventive interconnect structure includes:

at least one conducting metal feature formed atop a substrate;

at least one interlayer dielectric layer surrounding at least one metal feature; and a ceramic diffusion barrier formed between at least one interlayer dielectric layer and at least one conducting metal feature, said ceramic diffusion barrier having a composition $Si_vN_wC_xO_yH_z$, where $0.1 \leq v \leq 0.9$, $0 \leq w \leq 0.5$, $0.01 \leq x \leq 0.9$, $0 \leq y \leq 0.7$, $0.01 \leq z \leq 0.8$ for $v+w+x+y+z=1$.

In a first example of the first embodiment, a preceramic polymeric precursor is applied by a solvent based approach (e.g., spin-coating) to generate the ceramic diffusion barrier layer, also referred to as a cap barrier layer film. The remaining interconnect structure may be comprised of a via level dielectric, a line level dielectric, hardmask layers, and buried etch stop layers.

In a second example of the first embodiment, the preceramic polymeric precursor is applied in the same manner as above to generate a cap barrier layer film and is used simultaneously as a low-k cap barrier layer and a via level dielectric. This approach produces an interconnect structure having a hybrid interlayer dielectric, where the line level dielectric layers may be any dielectric and the via level dielectric and ceramic diffusion barrier layer are combined into one layer.

In a third example of the first embodiment, the preceramic polymeric precursor is applied in the same manner as above to generate a ceramic diffusion barrier layer and is used simultaneously as a low-k ceramic diffusion barrier layer, a via level interlayer dielectric, and a line level interlayer dielectric. This approach produces an interconnect structure having an interlayer dielectric where both the via and line level dielectric layers are combined with the ceramic diffusion barrier layer to form a continuous interlayer dielectric layer.

In a fourth example of the first embodiment, the preceramic polymeric precursor is applied in the same manner as above to generate a ceramic diffusion barrier layer onto an interconnect structure having a interlayer dielectric comprised of at least two dielectrics, where the dielectric underneath the metal lines chemically differs from the dielectric in other regions.

The ceramic diffusion barrier layer has a low dielectric constant of less than about 3.3, preferably less then about 2.8, and even more preferably about 2.6. The ceramic diffusion barrier layer also prohibits metal diffusion (preferably copper), and is thermally stable to temperatures of about 300° C. The ceramic diffusion barrier layer may also contain porosity that further reduces the dielectric constant "k" to less than about 2.6, most preferably about 1.6. The pores may be generated by a removal of a sacrificial moiety that may be polymeric. The pores may also be generated by a process that involves the elimination of a high boiling point solvent. The pores may have a size scale of about 0.5 nm to about 20 nm and may have a closed cell morphology.

In a second embodiment of this invention, a method to produce the ceramic diffusion barrier layer is described. In broad terms the inventive method includes the steps of:

applying a coating of a polymeric preceramic precursor onto a substrate having at least one metal region and at least one insulating region, where the polymeric preceramic precursor has a composition of $Si_vN_wC_xO_yH_z$, where $0.1 \leq v \leq 0.8$, $0 \leq w \leq 0.8$, $0.05 \leq x \leq 0.8$, $0 \leq y \leq 0.3$, $0.05 \leq z \leq 0.8$ for $v+w+x+y+z=1$; and converting the polymeric preceramic precursor into a ceramic diffusion barrier layer, where the ceramic diffusion barrier prohibits the diffusion of metal.

The polymeric preceramic precursor, utilized in the second embodiment, may also have the composition $Si_vN_wC_xO_yH_z$, where $0.1<v<0.8$, $0<w<0.8$, $0.05<x<0.8$, $0<y<0.3$, $0.05<z<0.8$, and $v+w+x+y+z=1$.

More specifically, a polymeric preceramic precursor is first dissolved in a suitable solvent and then spin coated onto a interconnect structure, having metal and dielectric material exposed at it's uppermost surface, to form a ceramic diffusion barrier layer. The ceramic diffusion barrier layer may be annealed at elevated temperatures, e.g., from about 200° C. to about 400° C., to eliminate residual solvent and to crosslink the material. Conventional processing may follow the formation of the ceramic diffusion barrier layer to produce interconnect structures having a low-k barrier layer film and separating metal lines from interlayer dielectric layers.

Upon coating, the polymeric preceramic precursor film is converted to a ceramic diffusion barrier layer through the use of one or a combination of any suitable process including: thermal curing, electron irradiation, ion irradiation, irradiation with ultraviolet and/or visible light, etc. During this process, the polymeric preceramic precursor may crosslink into a rigid, insoluble matrix to form the ceramic diffusion barrier layer. The resultant ceramic diffusion barrier layer may have a dielectric constant less than about 3.3, be thermally stable, have low leakage currents, have a high breakdown field value, and prohibits the diffusion of metal (preferably copper). For systems generated from silicon containing polymeric preceramic precursors, the ceramic diffusion barrier layer may have a composition of $Si_vN_wC_xO_yH_z$, where $0.1 \leq v \leq 0.9$, $0 \leq w \leq 0.5$, $0.01 \leq x \leq 0.9$, $0 \leq y \leq 0.7$, $0.01 \leq z \leq 0.8$ for $v+w+x+y+z=1$. The ceramic diffusion barrier layer may also have a composition of $Si_vN_wC_xO_yH_z$, where $0.1<v<0.9$, $0<w<0.5$, $0.01<x<0.9$, $0<y<0.7$, $0.01<z<0.8$ for $v+w+x+y+z=1$.

In a third embodiment of this invention, compositions for producing a ceramic diffusion barrier layer are described. The polymeric preceramic precursor is a molecule that is used to form a ceramic diffusion barrier layer that has a low dielectric constant ($k \leq 3.3$), prohibits metal diffusion, and is thermally stable to temperatures of about 300° C. The polymeric preceramic precursor may have any chain architecture (including linear, networked, branched, dendrimeric) and can contain one or more monomeric units in any sequential arrangement (random, alternating, block, tapered, etc.). The polymeric preceramic precursor can also be a physical mixture of two or more polymeric components.

The polymeric preceramic precursor may be selected from systems having silicon as part of the backbone structure including: polysilazanes, polycarbosilanes, polysilasilazanes, polysilanes, polysilanes, polysilacarbosilanes, polysiloxazanes, polycarbosilazanes, and polysilacarbosilazanes. The polymeric preceramic precursor may have pendant functional groups bonded to the chain backbone including, but not limited to: hydrido, vinyl, allyl, alkoxy, and alkyl groups. The polymeric preceramic precursor may also be comprised of a system having a carbon backbone and pendant functional groups comprised of at least Si and N, and may also have C, O, and H. An example of such a material is poly(silylcarbodiimides). In general, these silicon containing polymeric preceramic precursors may lead to a ceramic diffusion barrier layer having a composition of $Si_vN_wC_xO_yH_z$, where $0.1 \leq v \leq 0.9$, $0 \leq w \leq 0.5$, $0.01 \leq x \leq 0.9$, $0 \leq y \leq 0.7$, $0.01<z<0.8$ for $v+w+x+y+z=1$. The silicon containing polymeric preceramic precursors may also lead to a ceramic diffusion barrier layer having a composition of $Si_vN_wC_xO_yH_z$, where $0.1<v<0.9$, $0<w<0.5$, $0.01<x<0.9$, $0<y<0.7$, $0.01<z<0.8$ for $v+w+x+y+z=1$.

BRIEF DESCRIPTION OF THE DRAWINGS

FIG. 1 is a cross sectional view of a semiconductor device in accordance with the invention.

FIG. 2 is a cross sectional view of another semiconductor device in accordance with the invention.

FIG. 3 is a general process flow for generation of ceramic diffusion barrier layers in accordance with the invention.

DESCRIPTION OF THE PREFERRED EMBODIMENTS

Figures 4A, 4B:
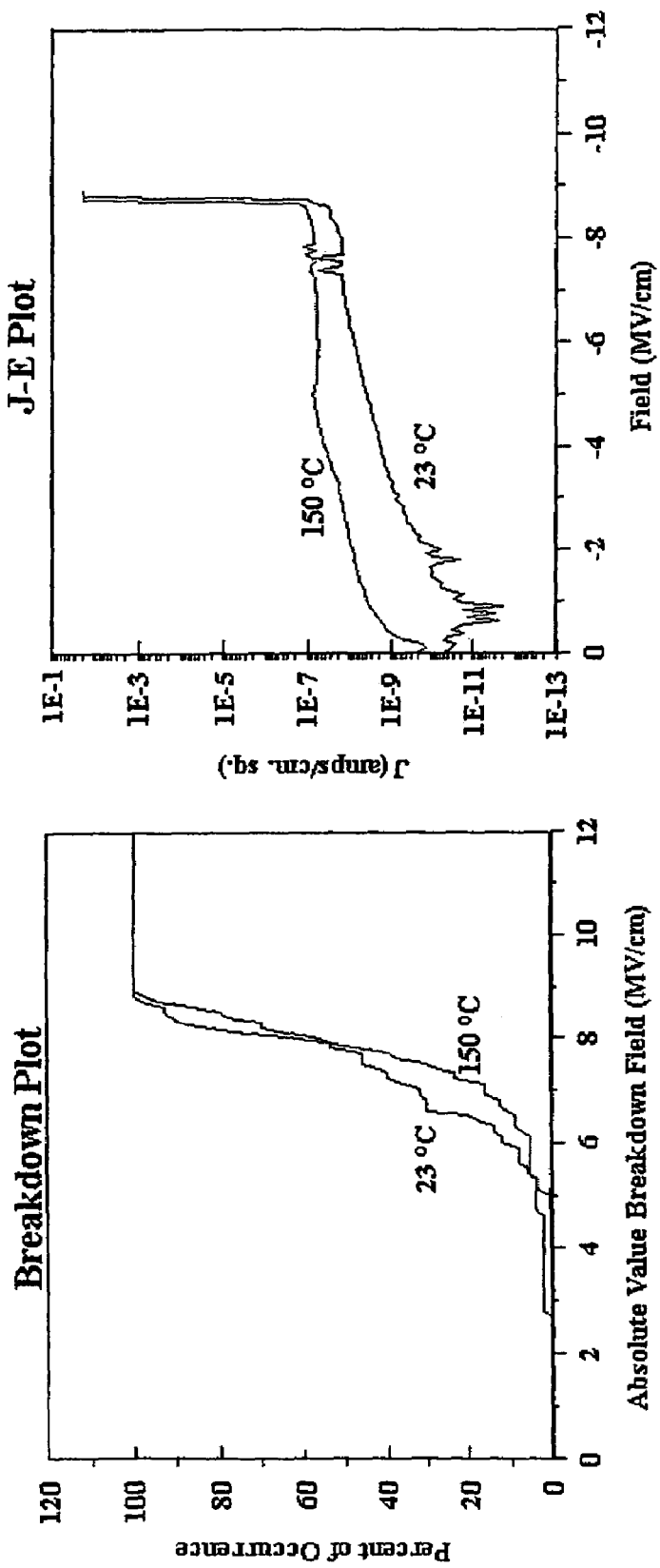
FIGS. 4(a) and 4(b) are examples of electrical characteristics of a ceramic diffusion barrier layers in accordance with the invention.

The structures, methods, and compositions relating to the inventive ceramic diffusion barrier layer of the present invention will now be discussed in greater detail referring to the drawings accompanying the present invention. It is noted that in the accompanying drawings, like and corresponding elements are referred to by like reference numbers.

In accordance with the invention, an interconnect structure is provided containing metal and dielectric components, where a ceramic diffusion barrier layer comprised of a dielectric material having a low dielectric constant (k<3.3) serves as a barrier to metal diffusion. The ceramic diffusion barrier layer is generated from a polymeric preceramic precursor that is deposited onto the intended interconnect structure by a solvent based process including, but not limited to: spin coating, scan coating, spray coating, dip coating, using a doctor blade, etc. The film may have a thickness of from about 5 nm to about 1000 nm. Suitable solvents include any of those commonly used in coating including, but not limited to: propylene glycol methyl ether acetate (PGMEA), propylene glycol methyl ether (PGME), toluene, xylenes, mesitylene, butyrolactone, ketones, cyclohexanone, hexanones, heptanones, and ethyl lactate.

Optionally, the interconnect structure can be cleaned using any suitable process known in the art prior to the deposition of the polymeric preceramic precursor. The cleaning may be a wet clean involving exposures to acids, bases and organic solvents. The cleaning may also involve any dry etch process known in the art.

The polymeric preceramic precursor film is then converted to a ceramic diffusion barrier layer through the use of one or a combination of any suitable process including, but not limited to: thermal curing, electron irradiation, ion irradiation, irradiation with ultraviolet and/or visible light. Thermal anneals may be performed at temperatures in excess of about 400° C. and may be performed in an inert atmosphere. During this process, the polymeric preceramic precursor may crosslink into a rigid, insoluble matrix to form the cap barrier layer film, which may have a dielectric constant less than about 3.3. In addition, the ceramic diffusion barrier layer typically is thermally stable, having low leakage currents, high breakdown field values, and prohibits the diffusion of metal (preferably copper) through the film.

Referring to FIG. 1, in the first embodiment, an example of an interconnect structure 40, comprised of multiple levels 1000 where each level may consist of a via level 1100 and line level 1200, is shown. The interconnect structure contains conducting metal features 33 that traverse through the structure and may have interfaces with a lining metal containing barrier 34. The conducting metal features 33 and lining metal containing barrier 34 are surrounded by dielectrics. The dielectrics in the via level 1100 include the via level dielectric 32 and the ceramic diffusion barrier layer 36. The dielectrics in the line level 1200 include the line level dielectric 31 and an optional hardmask dielectric 41. Optionally, a dielectric etch stop layer 37 may be placed between the via level dielectric 32 and line level dielectric 31. The line level dielectric 31 may contain a hardmask dielectric 41 that differs in composition from the remainder of the line level dielectric 31.

The interconnect structure can be generated by a number of sequential processing steps including the use of lithography, chemical mechanical polishing (CMP), reactive ion etching, thermal annealing, wet chemical cleans, film deposition by solvent based coating, film deposition by chemical vapor deposition, and combinations thereof.

The ceramic diffusion barrier layer 36 is generated from a polymeric preceramic precursor that is applied onto the interconnect structure by any solvent based coating schemes including, but not limited to: spin coating, scan coating, dip coating, spray coating and combinations thereof. The polymeric preceramic precursor is then converted into the ceramic diffusion barrier layer 36 through the use of one or a combination of any suitable processes including: thermal curing, electron irradiation, ion irradiation, irradiation with ultraviolet and/or visible light, etc. During this process, the polymeric preceramic precursor may crosslink into a rigid, insoluble matrix. The resultant ceramic diffusion barrier layer 36 has a low dielectric constant (k<3.3), prohibits metal diffusion (preferably copper), and is thermally stable to temperatures of about 300° C.

The polymeric preceramic precursor can have any chain architecture (including linear, networked, branched, dendrimeric) and can contain one or more monomeric units in any sequential arrangement (homopolymer, random copolymer, alternating, block copolymer, tapered, polymer blend, etc.). The polymeric preceramic precursor can also be a mixture of two or more polymeric components. The polymeric preceramic precursor may have a molecular weight between approximately 500 and approximately 1000000.

The polymeric preceramic precursor may be selected from systems having silicon as part of the backbone structure including: polysilazanes, polycarbosilanes, polysilasilazanes, polysilanes, polysilacarbosilanes, polysiloxazanes, polycarbosilazanes, polysilylcarbodiimides, and polysilacarbosilazanes. The polymeric preceramic precursor may also have some component of polysiloxanes or polysilsesquioxane in the structure. The polymeric preceramic precursor may also be polyureamethylvinylsilazane or polyureamethylvinylsilazane (KiON). The polymeric preceramic precursor may have pendant functional groups bonded to the chain backbone including, hydrido, vinyl, allyl, alkoxy, silyl, and alkyl groups. The polymeric preceramic precursor may also be comprised of a system having a carbon backbone and pendant functional groups comprised of at least Si and N, and may also have C, O, and H. An example of such a material is poly(silylcarbodiimides).

The polymeric preceramic precursor may also have pendant functional groups bonded to the chain backbone that may have a binding affininty to metal including: amines, amides, imides, thioesters, thioethers, ureas, urethanes, nitriles, isocyanates, thiols, sulfones, phosphines, phosphine oxides, phosphonimides, benzotriazoles, pyridines, imidazoles, imides, oxazoles, benzoxazoles, thiazoles, pyrazoles, triazoles, thiophenes, oxadiazoles, thiazines, thiazoles, quinonoxalines, benzimidazoles, oxindoles, and indolines. In general, these silicon containing polymeric preceramic precursors may have a composition of $Si_vN_wC_xO_yH_z$, where $0.1 \leq v \leq 0.8$, $0 \leq w \leq 0.8$, $0.05 \leq x \leq 0.8$, $0 \leq y \leq 0.3$, $0.05 \leq z \leq 0.8$ for $v+w+x+y+z=1$. The silicon containing polymeric precursor may also have a composition $Si_vN_wC_xO_yH_z$, where $0.1<v<0.8$, $0<w<0.8$, $0.05<x<0.8$, $0<y<0.3$, $0.05<z<0.8$, and $v+w+x+y+z=1$.

For systems generated from the silicon containing polymeric preceramic precursors, the ceramic diffusion barrier layer may have a composition of $Si_vN_wC_xO_yH_z$, where $0.1 \leq v \leq 0.9$, $0 \leq w \leq 0.5$, $0.01 \leq x \leq 0.9$, $0 \leq y \leq 0.7$, $0.01 \leq z \leq 0.8$ for $v+w+x+y+z=1$. The ceramic diffusion barrier may also have a composition of $Si_vN_wC_xO_yH_z$, where $0.1<v<0.9$, $0<w<0.5$, $0.01<x<0.9$, $0 \leq y \leq 0.7$, $0.01<z<0.8$ for $v+w+x+y+z=1$. An example of a preferred composition for the ceramic diffusion barrier layer is $Si_{0.16}N_{0.17}C_{0.17}H_{0.5}$.

The line level dielectric and via level dielectric are dielectric materials having low dielectric constants (k<3) and are thermally stable to temperatures greater than about 300° C. The preferred materials for the line level dielectric 32 and via level dielectric 31 are: polysiloxanes, polysilsesquioxanes, polyarylenes, poly(arylene ethers) and dielectrics that are generated by chemical vapor deposition approaches having the composition $Si_vN_wC_xO_yH_z$, where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$. The dielectric composition may also be $Si_vN_wC_xO_yH_z$, where $0.05<v<0.8$, $0<w<0.9$, $0.05<x<0.8$, $0<y<0.8$, $0.05<z<0.8$ for $v+w+x+y+z=1$. Optionally, the dielectric may be air or an inert gas. The low dielectric constant material may also be porous. In one embodiment the line level dielectric layer has a first composition and the via level dielectric has a second composition, where the first composition is different from the second composition.

Optionally, a hard mask dielectric 41 may be used. The hard mask dielectric may have a thickness ranging from about 5 nm to about 100 nm. The preferred materials for the hard mask dielectric are: polysiloxanes, polysilsesquioxanes, or CVD deposited dielectrics having the composition $Si_vN_wC_xO_yH_z$, where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$. The dielectrics may also comprise of $Si_vN_wC_xO_yH_z$, where $0.05<v<0.8$, $0<w<0.9$, $0.05<x<0.8$, $0<y<0.8$, $0.05<z<0.8$ for $v+w+x+y+z=1$ Optionally, a dielectric etch stop layer 37 may be placed between the via level dielectric 32 and line level dielectric 31. The dielectric etch stop layer may have a thickness ranging from about 5 nm to about 100 nm. The preferred materials for the dielectric etch stop are: polysiloxanes, polysilsesquioxanes, or any CVD deposited dielectric having a composition comprised of $Si_vN_wC_xO_yH_z$, where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$. $Si_vN_wC_xO_yH_z$, where $0.05<v<0.8$, $0<w<0.9$, $0.05<x<0.8$, $0<y<0.8$, $0.05<z<0.8$ for $v+w+x+y+z=1$, may also be the composition of the gate dielectric and line level dielectric.

The preferred materials for the conducting metal features are copper, gold, silver, aluminum and alloys thereof. The conducting metal features may have layers at the top surface that reduce electromigration including materials comprised of cobalt, tungsten, and phosphorous. The conducting metal features may have a moiety at the top surface that reduces the propensity for oxidation of the metal including: benzotriazoles, amines, amides, imides, thioesters, thioethers, ureas, urethanes, nitrites, isocyanates, thiols, sulfones, phosphines, phosphine oxides, phosphonimides, pyridines, imidazoles, imides, oxazoles, benzoxazoles, thiazoles, pyrazoles, triazoles, thiophenes, oxadiazoles, thiazines, thiazoles, quionoxalines, benzimidazoles, oxindoles, and indolines. The preferred materials for the lining metal containing barrier are tantalum, tantalum nitride, tungsten, titanium, titanium nitride, ruthernium, TiSiN, and combinations thereof.

Referring to FIG. 2, in the first embodiment, another example of an interconnect structure 40, comprised of multiple levels 1000 where each level may consist of a via level 1100 and line level 1200, is shown. The interconnect structure contains conducting metal features 33 that traverse through the structure and may have interfaces with a lining metal containing barrier 34. The conducting metal features 33 and lining metal containing barrier 34 are surrounded by dielectrics. The dielectrics in the line level 1200 include the line level dielectric 43 and an optional hardmask dielectric. The dielectrics in the via level 1100 include the via level dielectric 32 that are present under conducting metal lines, line level dielectric 43 which are present in regions not having metal lines atop the via level, and the ceramic diffusion barrier layer 36. Optionally, a dielectric etch stop layer 37 may be placed between the via level dielectric 42 and line level dielectric 43.

Referring to FIG. 3, the general process flow for the production of ceramic diffusion barrier layers is shown. In step 1, a solution is prepared including the polymeric preceramic precursor using any solvent commonly used for coating purposes including, but not limited to: propylene glycol methyl ether acetate (PGMEA), propylene glycol methyl ether (PGME), toluene, xylenes, anisole, mesitylene, butyrolactone, ketones, cyclohexanone, hexanones, ethyl lactate and heptanones.

An optional antistriation agent may be codissolved in the solution containing the polymeric preceramic precursor to produce films of high uniformity. The amount of antistriation agent may be less than about 1% of the solution containing the polymeric preceramic precursor.

An optional adhesion promoter may also be codissolved in the solution containing the polymeric preceramic precursor and may segregate to film interfaces during application of the polymeric preceramic precursor. The adhesion promoter may comprise of less than about 2% of the solution containing the polymeric preceramic precursor.

In optional step 2, the interconnect structure may be cleaned prior to the deposition of the polymeric preceramic precursor. The cleaning may be a wet clean involving exposures to acids, bases, and/or organic solvents. The cleaning process step may also involve any dry etch process known in the art. In optional step 3, adhesion promoters may be applied to the substrate surface (e.g., interconnect structure). A preferred adhesion promoter has the composition $Si_xL_yR_z$, where L is selected from the group consisting of hydroxy, methoxy, ethoxy, acetoxy, alkoxy, carboxy, amines, halogens, and R is selected from the group consisting of hydrido, methyl, ethyl, vinyl, and phenyl (any alkyl or aryl). The adhesion promoter may also be hexamethyldisilazane, vinyltriacetoxysilane, aminopropyltrimethoxysilane, vinyl trimethoxysilane or combinations thereof.

In step 4, the intended substrate is then coated with the polymeric preceramic precursor by a solvent based process including: spin coating, scan coating, spray coating, dip coating, using a doctor blade or combinations thereof The polymeric preceramic precursor may have a thickness of about 5 nm to about 1000 nm. In optional step 5, adhesion promoters may be applied to the top surface of the film comprised of the polymeric preceramic precursor. Preferred adhesion promoters include those mentioned above.

In step 6, the polymeric preceramic precursor is converted into the ceramic diffusion barrier layer through the use of one or a combination of any suitable process including: thermal curing, electron irradiation, ion irradiation, irradiation with ultraviolet and/or visible light, etc. In the case of thermal annealing, the anneals may be performed at temperatures in excess of about 400° C. and under inert atmospheres including, nitrogen, forming gas, and argon. During this process, the polymeric preceramic precursor may crosslink into a rigid, insoluble matrix. If the optional codissolved adhesion promoter is used, the adhesion promoter may segregate to film interfaces during this conversion process. In optional step 7, adhesion promoters may be applied to top surface of the ceramic diffusion barrier layer. Preferred adhesion promoters include those mentioned above.

The solution containing the polymeric preceramic precursor may also contain moieties that produce porosity, including sacrificial polymeric materials that degrades into low molecular weight byproducts and/or high boiling point solvents that are expelled from the film during the conversion of the polymeric preceramic precursor into the ceramic diffusion barrier layer. The sacrificial polymeric material may be selected from the group consisting of: poly(stryenes), poly(esters), poly(methacrylates), poly(acrylates), poly(glycols), poly(amides), and poly(norbornenes).

The ceramic diffusion barrier layer preferably has a dielectric constant less than 3.3, is thermally stable, has low leakage currents, has high breakdown field values, and prohibits the diffusion of metal (preferably copper) through the film. Referring to FIGS. 4(*a*) and 4(*b*), suitable breakdown characteristics and leakage current characteristics are demonstrated for a film generated from a polysilazane preceramic precursor, as low percentages of breakdowns are observed for fields less than 7 MV/cm (FIG. 4(*a*)) and the leakage currents are less than $10^{-7}$ amps/cm$^2$ at both room temperature and 150° C. (FIG. 4(*b*)).

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications that come within the scope of the appended claims.

What is claimed is:

1. A method of forming a ceramic diffusion barrier layer comprising:
   preparing a solution of a polymeric preceramic precursor a, sacrificial moiety and a solvent, said sacrificial moiety, which produces porosity, selected from the group consisting of poly(styrenes), poly(esters), poly(methacylates), poly(acrylates), poly(glycols), poly(amides) and poly(norbornenes); applying said solution by a solvent based process onto a semiconducting substrate, where said polymeric preceramic precursor has a composition of $Si_vN_wC_xO_yH_z$, where $0.1 \leq v \leq 0.8$, $0 \leq w \leq 0.8$, $0.05 \leq x \leq 0.8$, $0 \leq y \leq 0.3$, $0.05 \leq z \leq 0.8$, and $v+w+x+y+z=1$; and
   converting said polymeric preceramic precursor into a ceramic diffusion barrier layer, where said ceramic diffusion barrier prohibits metal diffusion.

2. The method of claim 1, wherein said polymeric preceramic precursor comprises polysilazanes, polycarbosilanes, polysilasilazanes, polysilanes, polysilacarbosilanes, polysiloxazanes, polycarbosilazanes, polysilylcarbodiimides, or polysilacarbosilazanes.

3. The method of claim 1, wherein said solvent based process comprises spin coating, spray coating, scan coating, dip coating, or combinations thereof.

4. The method of claim 1, where said solution further comprises:
   an adhesion promoter codissolved in said solvent containing said polymeric preceramic precursor, where said adhesion promoter has a composition of $Si_xL_yR_z$, where L is selected from the group consisting of hydroxyl, methoxy, ethoxy, acetoxy, alkoxy, caboxy, amines or halogens, and R is selected from the group consisting of hydrido, methyl, ethyl, vinyl, and phenyl.

5. The method of claim 1, wherein said solvent comprises propylene glycol methyl ether acetate (PGMEA), propylene glycol methyl ether (PGME), toluene, xylenes, anisole, mesitylene, butyrolactone, cyclohexanone, hexanones, ethyl lactate, heptanones or combinations thereof.

6. The method of claim 1, wherein said conversion of said polymeric preceramic precursor into said ceramic diffusion barrier layer comprises thermal curing, electron irradiation, ion irradiation, irradiation with ultraviolet light, irradiation with visible light, or combinations thereof.

7. The method of claim 1, wherein an antistriation agent is codissolved in said solution containing said polymeric preceramic precursor.

8. The method of claim 1, wherein said semiconducting substrate comprises at least one metal region and at least one dielectric region, where said ceramic diffusion barrier is positioned between said at least one metal region and said at least one dielectric region.

* * * * *